United States Patent [19]

Chi

[11] Patent Number: 6,088,259
[45] Date of Patent: Jul. 11, 2000

[54] SRAM CELL USING TWO SINGLE TRANSISTOR INVERTERS

[75] Inventor: Min-hwa Chi, Hsinchu, Taiwan

[73] Assignee: Worldwide Semiconductor Manufacturing Corporation, Hsinchu, Taiwan

[21] Appl. No.: 09/253,322

[22] Filed: Feb. 19, 1999

[51] Int. Cl.[7] .................................................. G11C 11/00
[52] U.S. Cl. ........................... 365/154; 365/155; 257/300
[58] Field of Search ...................................... 365/154, 155, 365/156, 190, 149, 150; 257/300, 301

[56] References Cited

U.S. PATENT DOCUMENTS

| | | | |
|---|---|---|---|
| 4,532,609 | 7/1985 | Iizuka | 365/154 |
| 5,677,866 | 10/1997 | Kinoshita | 365/154 |
| 5,825,684 | 10/1998 | Lee | 365/154 |

*Primary Examiner*—Tan T. Nguyen
*Attorney, Agent, or Firm*—Blakely Sokoloff Taylor and Zafman

[57] ABSTRACT

A SRAM cell is disclosed. The SRAM cell comprises: a first inverter having an input and an output; a second inverter having an input and an output, the output of the second inverter capacitively coupled to the input of the first inverter, the input of the second inverter capacitively coupled to the output of the first inverter; a first access transistor controlled by a wordline and connected between the output of the first inverter and a bitline; and a second access transistor controlled by the wordline and connected between the output of the second inverter and a complement to the bitline.

4 Claims, 9 Drawing Sheets

SRAM CELL USING TWO SINGLE TRANSISTOR INVERTERS

FIELD OF THE INVENTION

The present invention generally relates to static random access memory (SRAM), and more particularly, to a small cell size SRAM using two single transistor inverters whose operation is based upon gate induced drain leakage (GIDL) current.

BACKGROUND OF THE INVENTION

Conventional SRAM cells use either six transistors (known as "6T SRAM") or four transistors and two resistors (known as "4T+2R SRAM"). The prior art 6T SRAM cell is schematically shown in FIG. 1. As seen, there are 6 MOS transistors in each cell. Two cross-coupled CMOS inverters (N1, P1 and N2, P2) are connected to two n-channel access transistors (N3 and N4). The SRAM cells are organized into an array in such a way such that the gates of access transistors in a row are connected to one word-line and the two drains of the access transistors are connected to a pair of bit lines (BL and BL-bar) in a column. Complementary data input is read or written through the column of BL and BL-bar and the word-line selects the specific cell to be written or read. The two cross-coupled inverters serve as a data latch to store data.

The prior art 4T+2R SRAM cell is shown in FIG. 2. This cell architecture uses polysilicon resistors as the load in each inverter (replacing the p-channel MOS transistors in the 6T SRAM cell). The 4T+2R SRAM cell is approximately 30 percent smaller than the 6T SRAM cell. This is accomplished by folding the polysilicon resistor on top of the n-channel MOS transistors in the inverter. The 4T+2R SRAM cell, however, is less stable than the 6T SRAM cell.

In each of the prior art SRAM cells in FIGS. 1 and 2, "local interconnects" must be used to connect the polysilicon gate of one inverter to the output of the other inverter. This adds additional manufacturing complexity and size to the SRAM cell.

What is needed is a SRAM cell that has a smaller size than that of the prior art.

SUMMARY OF THE INVENTION

A SRAM cell is disclosed. The SRAM cell comprises: a first inverter having an input and an output; a second inverter having an input and an output, said output of said second inverter capacitively coupled to the input of said first inverter, said input of said second inverter capacitively coupled to said output of said first inverter; a first access transistor controlled by a wordline and connected between the output of said first inverter and a bitline; and a second access transistor controlled by said wordline and connected between the output of said second inverter and a complement to said bitline.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention utilizes two-cross coupled single transistor inverters to form a SRAM cell. The inverter used is also of novel design and is disclosed in U.S. patent application Ser. No. 09/177,787 entitled "CMOS Inverter Using Gate Induced Drain Leakage Current" assigned to the same assignee herein and incorporated be reference.

The inverter is one of the most fundamental elements in digital integrated circuits. The inverter is a single input, single output digital device. If a "1" is input to the input of the inverter, the output of the inverter will be a "0". Conversely, if a "0" is input to the input of the inverter, the output of the inverter will be a "1". The inverter used in the present invention will first be described and then the architecture of the SRAM cell will be described.

Figure 1:
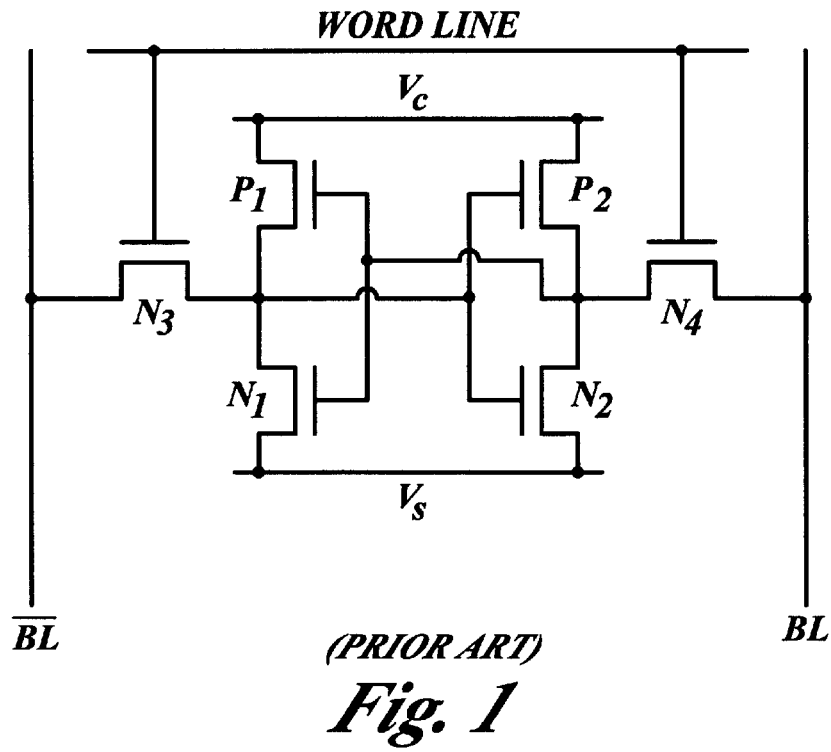
FIG. 1 is a schematic diagram of a prior art 6T SRAM cell.
Figure 2:
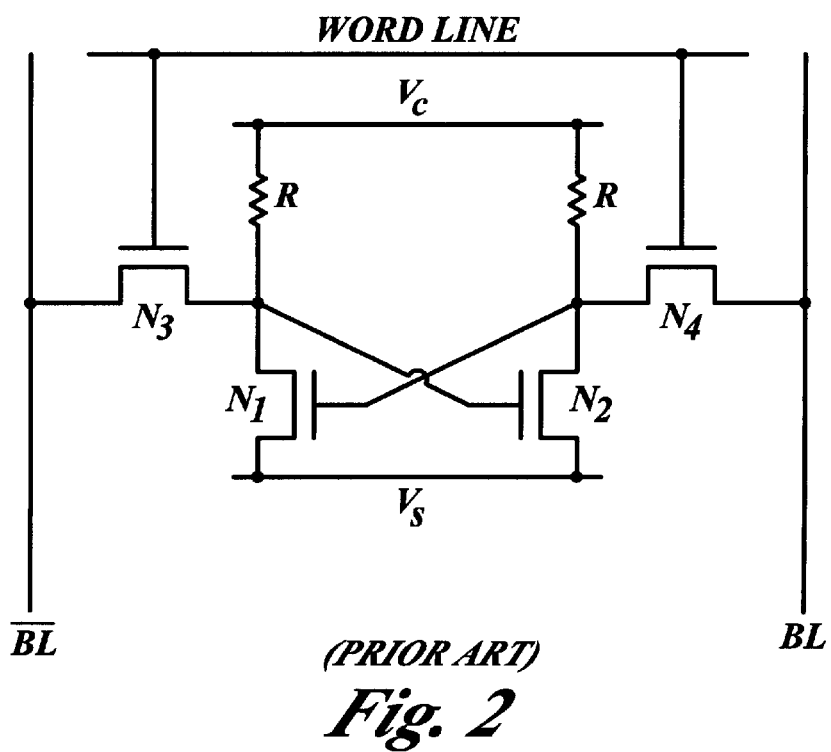
FIG. 2 is a schematic diagram of a prior art 4T+2R SRAM cell.
Figure 3:
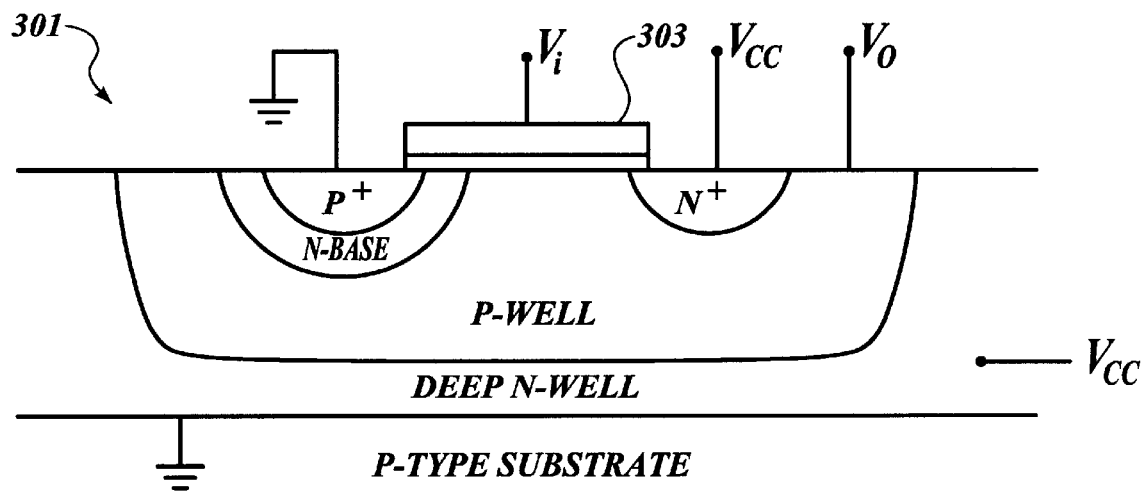
FIG. 3 is a cross-section view of a semiconductor substrate having formed therein a p-well CMOS inverter in accordance with the present invention.

A preferred embodiment of the inverter is shown in FIG. 3, wherein a p-type substrate is used as the foundation for the formation of a CMOS inverter 301. Then, an isolation area is formed by well-known techniques, such as local oxidation of silicon (LOCOS) or shallow trench isolation (STI). Formed in the p-type substrate is a deep n-well. Preferably, the deep n-well is formed by ion implantation using conventional methods. The deep n-well is preferably approximately 3 microns deep and has a dopant concentration of approximately $10^{15}/cm^3$.

Next, a p-well is formed in the deep n-well using conventional masking and ion implantation technology. The p-well is preferably approximately 1.5 microns deep and has a dopant concentration of $10^{16}/cm^3$.

Next, a gate oxide layer is formed over the substrate. The gate oxide is typically a thin silicon dioxide layer formed by thermal oxidation. Formed atop the gate oxide layer is an in situ doped polysilicon layer. The layer of polysilicon and the layer of gate oxide is then patterned and etched to form a gate structure 303.

After formation of the gate structure 303, an n− base is formed within the p-well. The n− base is self aligned to one edge of the gate structure 303. Preferably, the n– base is formed using conventional diffusion techniques or by a combination of ion implantation and thermal diffusion. As will be seen below, this allows a single mask to be used to form the n– base and the p+ structure. The thermal diffusion allows the n– base to expand laterally so that it extends underneath the gate structure 303. After diffusion, the n– base has a depth of 0.7 microns and has a dopant concentration of $10^{17}/cm^3$. Preferably, the dopant is phosphorous. Notice that the n– base physically separates the p+ region and the p– well Next, a p+ structure is formed within the n– base and is self-aligned to one edge of the gate structure 303. The same mask may be used to form the p+ structure as is used to form the n– base. The p+ structure preferably is formed using ion implantation to a depth of 0.3 microns and having a dopant concentration of $10^{20}/cm^3$. Preferably, the dopant used is boron.

Formed adjacent to the other edge of the gate structure 303 is an n+ structure. The n+ structure is formed in the p-well and is self-aligned to the gate structure 303. Preferably, the n+ structure has a depth of 0.3 microns and has a dopant concentration of $10^{20}/cm^3$.

Note that each of the manufacturing steps described above are commonly used in a CMOS process for forming prior art transistors. Therefore, the inverter of the present invention can be easily integrated into the process for forming standard CMOS transistors.

Finally, conventional methods are used to form contacts and interconnect to the various structures in the inverter 301. For example, the p+ structure and the p-type substrate are connected to ground (or more generically $V_{ss}$). The gate structure 303 is connected to an input terminal $V_i$. The n+ structure and the deep n-well are connected to a biasing voltage $V_{cc}$. Finally, the p-well is electrically connected to the output terminal $V_o$. For typical SRAM applications, $V_{ss}$ is ground and $V_{cc}$ is approximately 3.3 volts (for 0.35 micron CMOS) and approximately 2.5 volts (for 0.25 micron CMOS).

In operation, when the input bias $V_i$ is high (or approximately $V_{cc}$), electrons are generated on the surface of the p+ structure by band-to-band tunneling. These band-to-band tunneling generated electrons will flow into the n– base region (which is at a higher potential than the p+ structure) and pull down the n– base potential as well as the p– well potential to near ground. Similarly, when the input bias $V_i$ is low (approximately ground), holes are generated on the surface of the n+ structure by band-to-band tunneling. These band-to-band tunneling generated holes will flow into the p-well region (which is at a lower potential than the n+ structure) and pull up the p-well potential to approximately $V_{cc}$. Thus, the p-well potential is set by the above mechanism and is the opposite polarity to the input $V_i$.

Several points should be made of the inverter 301 of FIG. 3. First, the n– base should have a dopant concentration that is high enough so that there is no MOS action in the parasitic n-MOS or p-MOS. The p-well is floating and it serves as the output of the inverter 301. Moreover, there is no lightly doped drain (LDD) process needed, e.g. an LDD implant (phosphorous for n-type and boron for p-type), followed by spacer layer deposition and etch-back. Therefore, the surface of the n+ structure and the p+ structure can generate holes and electrons, respectively, by band-to-band tunneling (BBT). This, in turn, will result in gate-induced drain leakage (GIDL) current and will operate to change the potential of the p-well.

The GIDL current typically occurs in thin gate oxide MOS devices and is between the drain and the substrate. The basis of the GIDL current is band-to-band tunneling that occurs on the surface of the gate-to-drain overlap region. Additional information on GIDL current may be found in "Design for Suppression of Gate-Induced Drain Leakage in LDD MOSFET's Using a Quasi-2-Dimensional Analytical Model," by Parke et al., IEEE Transactions on Electron Devices, Vol. 39, No. 7, July 1992, pp. 694–1702. In that article, the authors explain that the surface of an n+ region underneath a gate edge experiences a high vertical electrical field (from the gate bias) that results in hole generation on the surface of an n+ region underneath the gate by band-to-band tunneling in the n+ region.

It should also be noted that the inverter 301 can be fabricated by a process that is fully compatible with standard CMOS processes. Specifically, all of the process steps described above to form the inverter 301 are commonly used in a CMOS process flow for the formation of transistors. Additionally, the inverter 301 is much smaller than a conventional CMOS inverter. Also important, there is no DC power consumption if the output is connected to the next stage by capacitive coupling. This is particularly useful for SRAMs, where there is no need of "local interconnect" technology.

Figure 4:
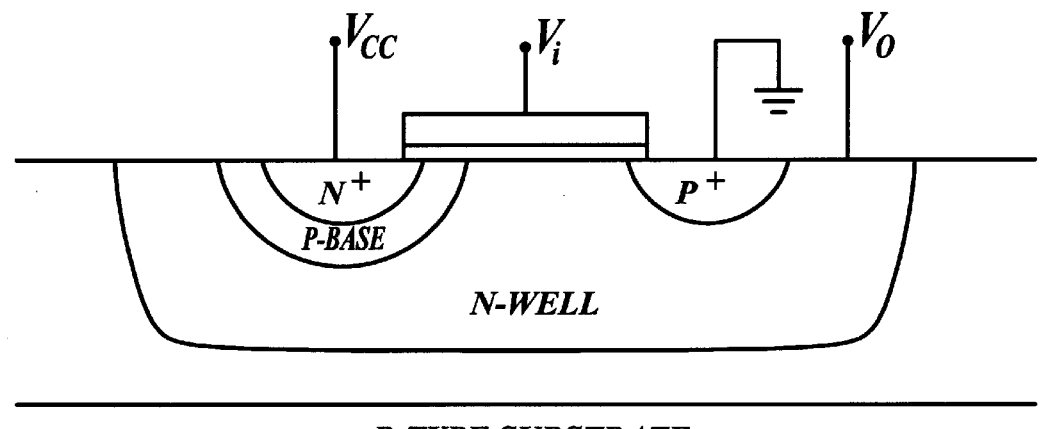
FIG. 4 is a cross-section view of a semiconductor substrate having formed therein an n-well CMOS inverter in accordance with the present invention.

By inverting the polarities of the conduction type and biases, a corresponding new inverter structure with an n-well as the output node may be manufactured. Such a device is shown in FIG. 4. Contacts and interconnects are formed to the various structures in the inverter 301. For example, the p+ structure and the p-type substrate are connected to ground (or more generically $V_{ss}$). The gate structure 303 is connected to an input terminal $V_i$. The n+ structure is connected to a biasing voltage $V_{cc}$. Finally, the n-well is electrically connected to the output terminal $V_o$.

For this embodiment, when the input bias $V_i$ is high (or approximately $V_{cc}$), electrons are generated on the surface of the p+ structure by band-to-band tunneling. These band-to-band tunneling generated electrons will flow into the n-well region (which has a higher potential than the p+ structure) and pull down its potential to approximately ground. Similarly, when the input bias is low (approximately ground), holes are generated on the surface of the n+ structure by band-to-band tunneling. These band-to-band tunneling generated holes will flow into the n-well region (which has a lower potential than the n+ structure) and pull up its potential to approximately $V_{cc}$. Thus, the n-well potential as set by the above mechanism and is the opposite to the input $V_i$.

Figure 5A:
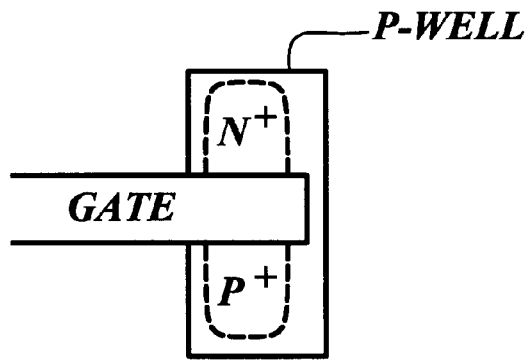
FIG. 5A is a top layout view of a p-well CMOS inverter in accordance with the present invention.
Figure 5B:
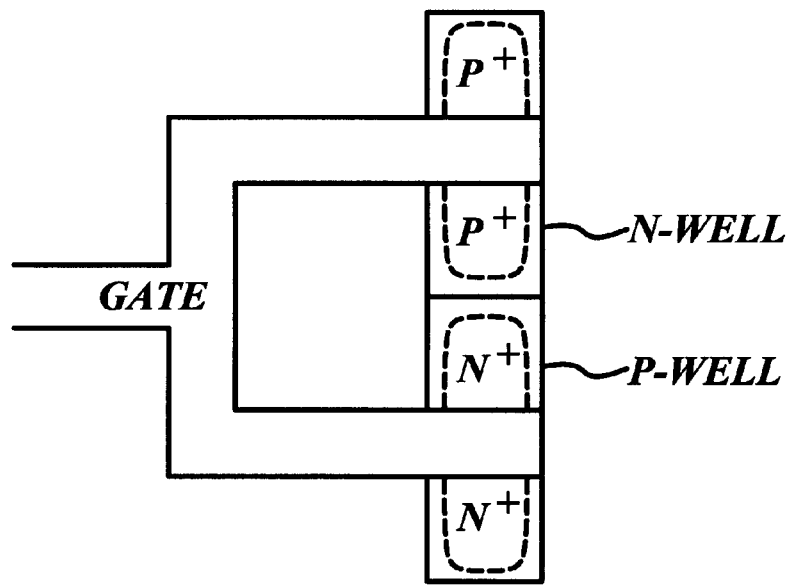
FIG. 5B is a top layout view of a prior art CMOS inverter.

A comparison of the layout implementation of a conventional prior art inverter and the inverter 301 of the present invention is shown in FIGS. 5A and 5B. As can be seen, the new inverter in accordance with the present invention is approximately 50 percent smaller than a conventional CMOS inverter.

Figure 6:
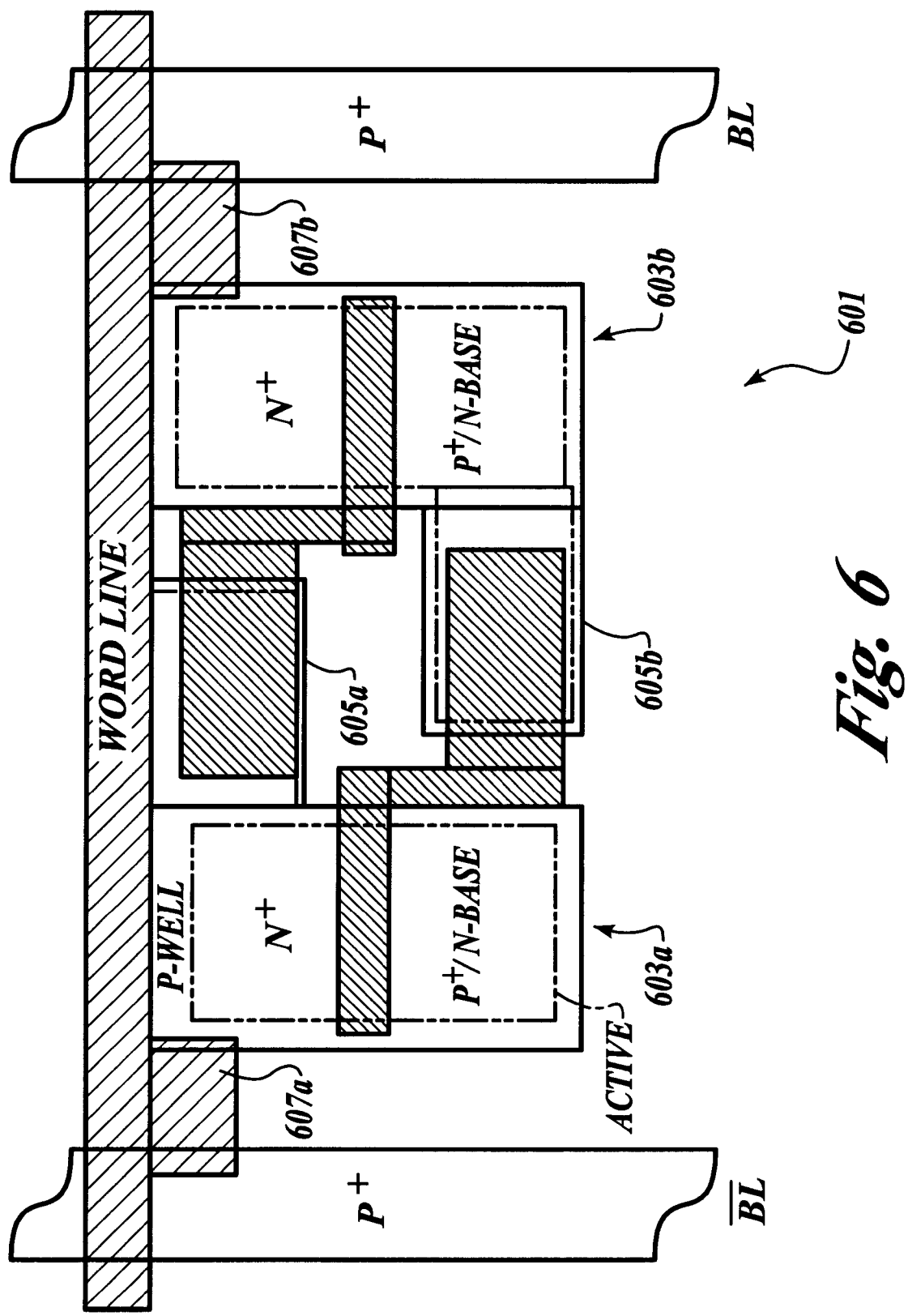
FIG. 6 is a top layout view of a SRAM cell formed in accordance with the present invention.
Figure 7:
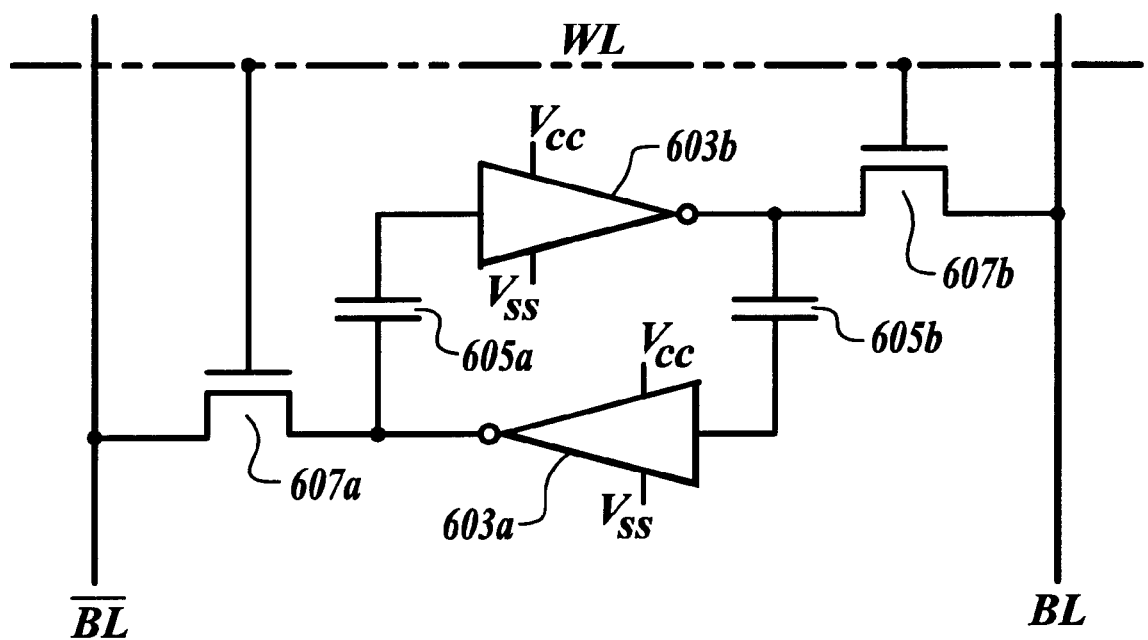
FIG. 7 is a schematic illustration of the SRAM cell of FIG. 6.

Turning to FIGS. 6 and 7, an SRAM cell 601 in accordance with the present invention is shown in top layout form (FIG. 6) and in schematic form (FIG. 7). As seen in FIG. 6, two p-well type inverters 603a and 603b are manufactured to be adjacent one another. The inverters 603a and 603b are substantially similar to the one shown in FIGS. 3 and 5A. One difference is that the p-well of each of the inverters have a capacitive appendage 605a and 605b that is used for capacitive coupling of the output of the inverter (from the p-well) to the gate (or input) of the other inverter.

Thus, the polysilicon gate structure 303 (see FIG. 3) of each inverter extends over to the capacitive appendage 605a and 605b of the other inverter. This interconnection can easily be made with the doped polysilicon layer used to form the gate structure 303. Although for ease of manufacturing and size considerations it is preferable to have capacitive coupling through the polysilicon layer, it can be appreciated by those skilled in the art that the implementation of cross-coupled inverters by conventional metal interconnect, contact, or local interconnect technology may be used as in conventional SRAM processes. For clarity, in FIG. 6, the connections for $V_{cc}$ and $V_{ss}$ are not shown.

In addition, as seen in FIG. 7, two p-channel transistors 607a and 607b are formed as access transistors. The access transistors are parasitic from the p-well to the BL and BL-bar column. The capacitors 605a and 605b in FIG. 7 represent the coupling capacitance from the polysilicon gate to the p-well capacitive appendages. The coupling area is relatively much larger than the polysilicon gate to the "channel" capacitance, thus, the coupling ratio can be close to 1. By using capacitive coupling in the SRAM cell, the need for local interconnect technology is eliminated and the cell size is reduced significantly.

Figure 8:
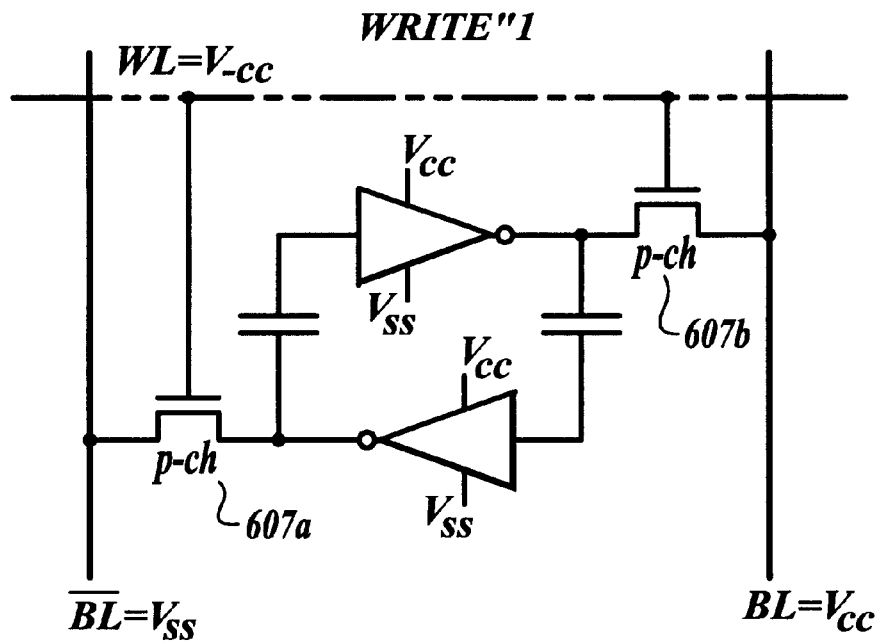
FIG. 8 is a schematic illustration of the SRAM cell of FIG. 6 during a write logic "1" operation.
Figure 9:
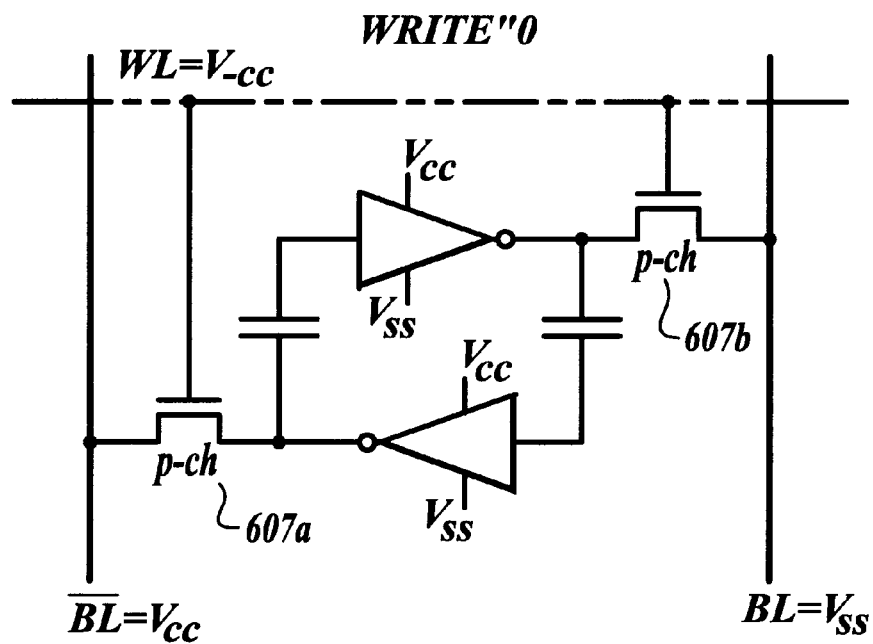
FIG. 9 is a schematic illustration of the SRAM cell of FIG. 6 during a write logic "0" operation.

Turning to FIGS. 8 and 9, the write operation for logic "1" and logic "0", respectively, is shown. In both instances, a negative wordline bias of $-V_{cc}$ is applied and the p-channel transistors 607a and 607b are turned on in the selected row. Data is thus written into the cross-coupled inverters. The un-selected wordlines (i.e. rows) are biased to ground (or higher potential) to turn off the access p-channel transistors. The write operation is thus similar to conventional SRAM circuits.

During the read operation, the column BL and BL-bar potential is typically initially equalized to $V_{cc}/2$ and then the wordline is biased to $-V_{cc}$ to turn on the selected row. Then, a column sense amplifier senses the differential signal from BL and BL-bar. This read operation is substantially similar to conventional SRAM cells.

Figure 10:
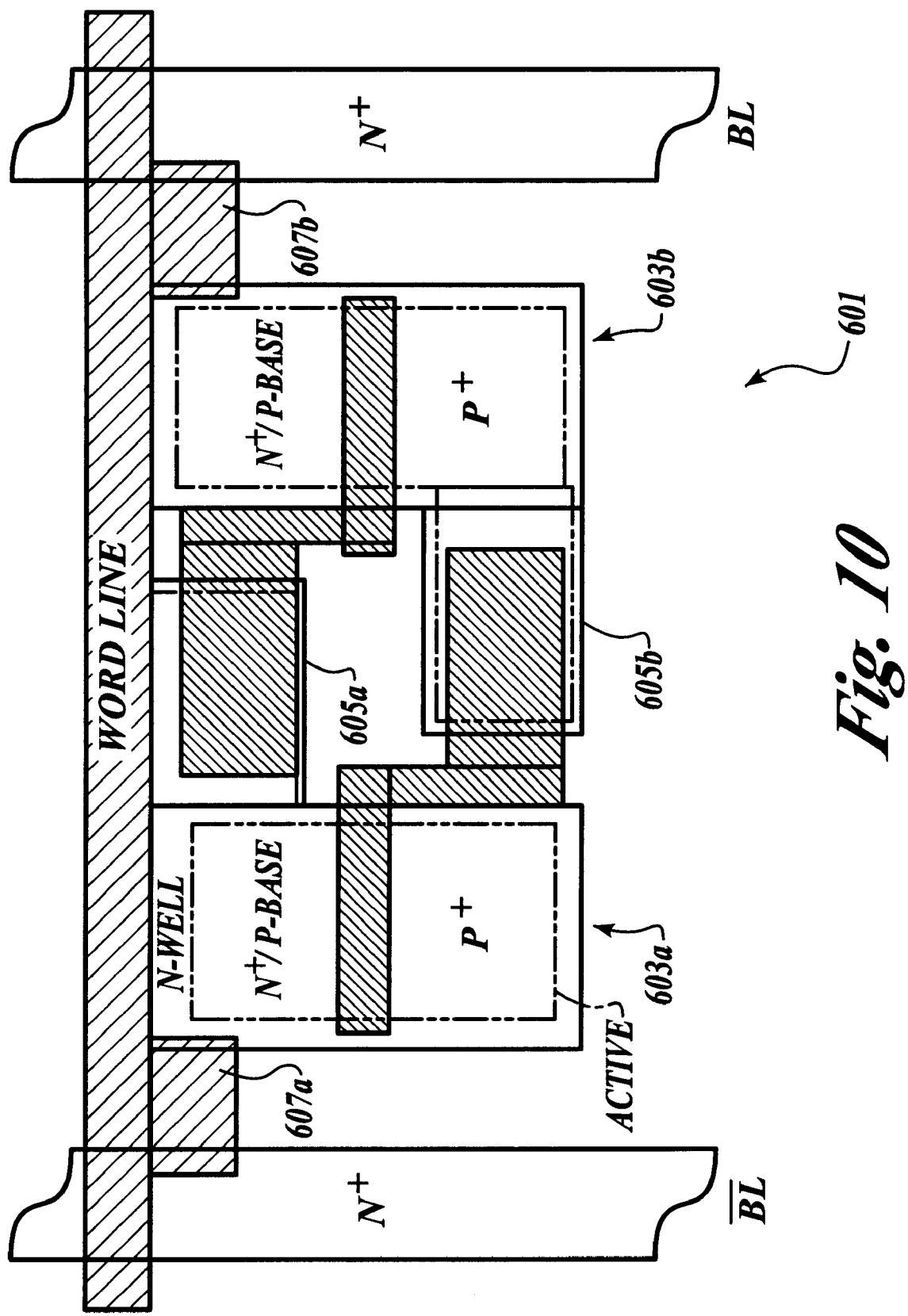
FIG. 10 is a top layout view of a SRAM cell formed in accordance with an alternative embodiment of the present invention.
Figure 11:
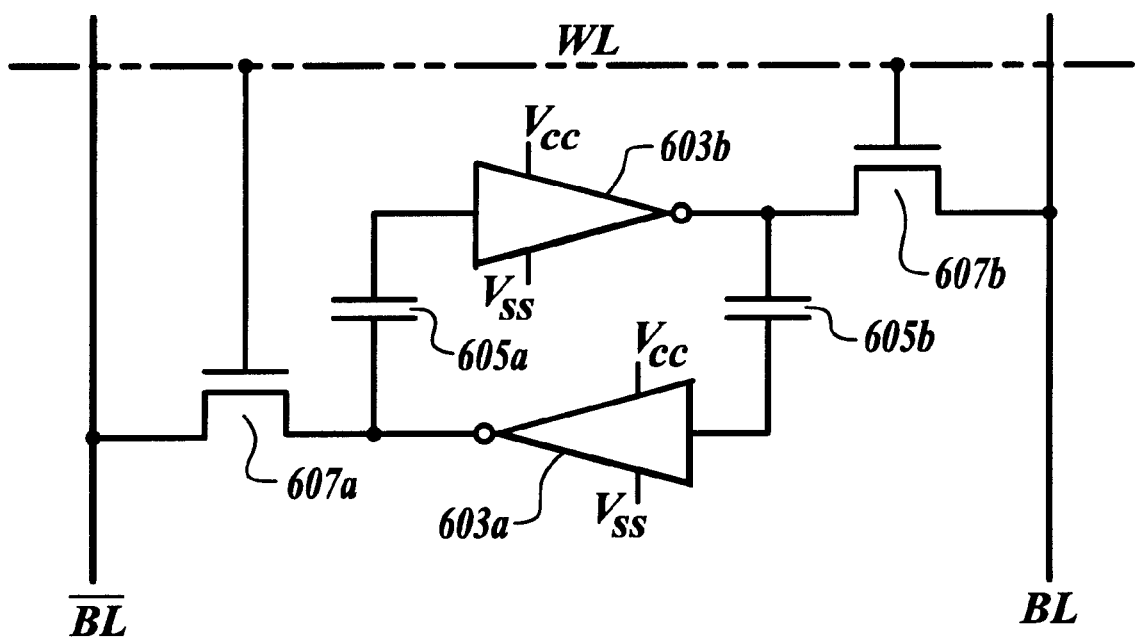
FIG. 11 is a schematic illustration of the SRAM cell of FIG. 10.
Figure 12:
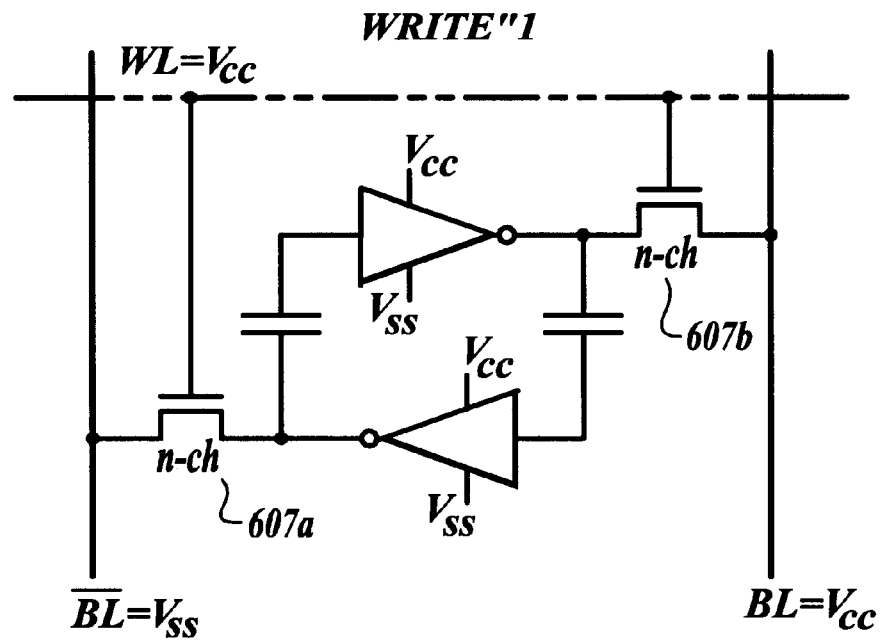
FIG. 12 is a schematic illustration of the SRAM cell of FIG. 10 during a write logic "1" operation.
Figure 13:
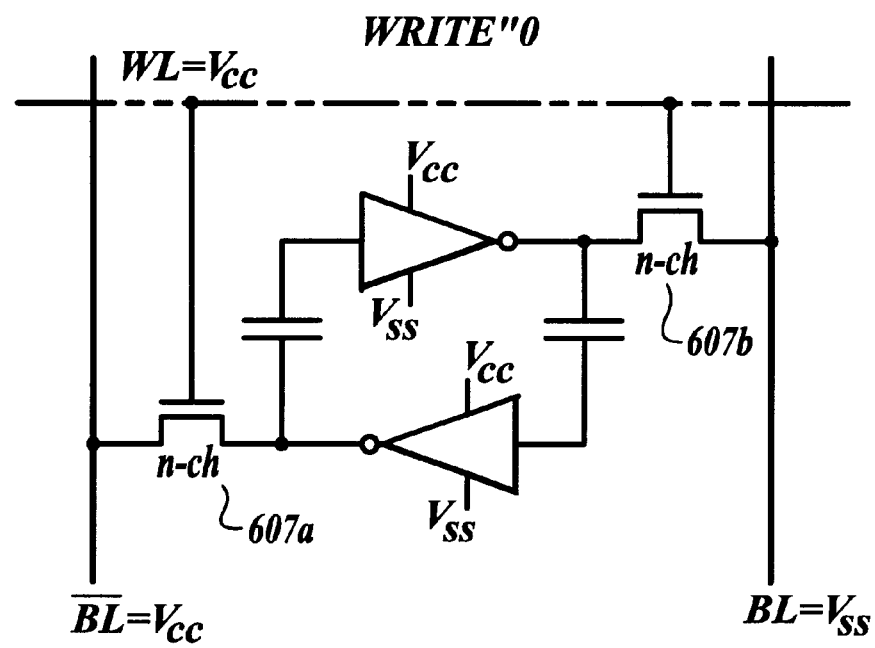
FIG. 13 is a schematic illustration of the SRAM cell of FIG. 10 during a write logic "0" operation.

In an alternative embodiment, n-well inverters can be used as seen in FIGS. 10 and 11. Note that the polarities of each of the structures has been changed. However, the layout of the inverters, bitlines, wordline, parasitic n-channel transistors, and other elements is exactly the same. FIGS. 12–13 illustrate the write operation of the n-type SRAM cell.

While the preferred embodiment of the invention has been illustrated and described, it will be appreciated that various changes can be made therein without departing from the spirit and scope of the invention.

What is claimed is:

1. A SRAM cell comprising:
   a first inverter having an input and an output;
   a second inverter having an input and an output, said output of said second inverter capacitively coupled to the input of said first inverter, said input of said second inverter capacitively coupled to said output of said first inverter; and
   a first access transistor controlled by a wordline and connected between the output of said first inverter and a bitline;
   wherein said first inverter and said second inverter each comprise:
      a p-well formed in said substrate, said p-well being the output of said inverter;
      a gate structure formed atop said p-well, said gate structure being the input of said inverter and being formed from a thin gate oxide layer underneath a conductive layer;
      an n– base formed adjacent to a first edge of said gate structure;
      a p+ structure formed within said n– base; and
      a n+ structure adjacent a second edge of said gate structure.

2. The SRAM cell of claim 1 further including a second access transistor controlled by said wordline and connected between the output of said second inverter and a complement to said bitline.

3. A SRAM cell comprising:
   a first inverter having an input and an output;
   a second inverter having an input and an output, said output of said second inverter capacitively coupled to the input of said first inverter, said input of said second inverter capacitively coupled to said output of said first inverter; and
   a first access transistor controlled by a wordline and connected between the output of said first inverter and a bitline;
   wherein said first inverter and said second inverter each comprise:
      a n-well formed in said substrate, said n-well being the output of said inverter;
      a gate structure formed atop said n-well, said gate structure being the input of said inverter and being formed from a thin gate oxide layer underneath a conductive layer;
      an p– base formed adjacent to a first edge of said gate structure;
      a n+ structure formed within said p– base; and
      a p+ structure adjacent a second edge of said gate structure.

4. The SRAM cell of claim 3 further including a second access transistor controlled by said wordline and connected between the output of said second inverter and a complement to said bitline.

* * * * *